United States Patent [19]

Zaderej et al.

[11] Patent Number: 5,127,838

[45] Date of Patent: Jul. 7, 1992

[54] PLATED ELECTRICAL CONNECTORS

[75] Inventors: Victor V. Zaderej, North Haven; James E. Betters, Madison, both of Conn.

[73] Assignee: General Electric Company, Worthington, Ohio

[21] Appl. No.: 484,579

[22] Filed: Feb. 23, 1990

[51] Int. Cl.⁵ .............................................. H01R 9/09
[52] U.S. Cl. ....................................... 439/74; 439/78; 439/931
[58] Field of Search ....................... 439/74, 78, 81, 86, 439/931

[56] References Cited

U.S. PATENT DOCUMENTS

| | | | |
|---|---|---|---|
| 3,529,082 | 9/1970 | Hoesli | 178/6.5 |
| 4,029,006 | 6/1977 | Mercer | 101/35 |
| 4,120,330 | 10/1978 | Weismann | 29/460 |
| 4,233,754 | 11/1980 | Dubuit | 34/203 |
| 4,414,298 | 11/1983 | Krenz | 429/99 |
| 4,584,767 | 4/1986 | Gregory | 29/848 |
| 4,591,220 | 5/1986 | Impey | 339/17 |
| 4,645,347 | 2/1987 | Rioux | 356/376 |
| 4,689,103 | 8/1987 | Elarde | 439/55 |
| 4,692,878 | 9/1987 | Ciongoli | 364/518 |
| 4,710,419 | 12/1987 | Gregory | 29/846 |
| 4,749,355 | 6/1988 | Hemmer | 439/63 |
| 4,764,849 | 8/1988 | Khan | 439/49 |
| 4,791,490 | 12/1988 | Knight et al. | 358/209 |
| 4,921,453 | 5/1990 | O'Brien | 439/931 |

OTHER PUBLICATIONS

IPC-MB-380 Draft Standard, Performance Specifications for Molded Printed Boards, Jan., 1987.
"Electrophoretic Photoresist Technology: An Image of the Future-Today", Vidusek, EPIC Winter Conference, Dec. 1988.
"Cast Spring"-A Plated, Molded Thermoplastic Electrical I/O Interface, Jack O'Brien, Connection Technology, Jun. 1989.
MINT-PAC Technologies Inc., "Solutions to Tomorrows Electronic Packaging Needs", Summer 1989 Promotional Literature.

Primary Examiner—Paula A. Bradley
Attorney, Agent, or Firm—Gary L. Loser

[57] ABSTRACT

A molded and plated or etched connector pair for mating together two printed wiring boards or the like. The female connector includes a column molded as a part of one PWB having a tapered passage therethrough. At least the inside of the tapered passage is plated with a conductive material which is connected to the bottom of the PWB through a plated through hole. The male connector member includes a block molded as a part of its PWB. The block includes a channel which mates with the column of the female connector. A plastic pin is disposed in the middle of the channel and mates with the tapered passage of the female member. The pin is plated with a conductive material and is coupled to the bottom of the male member's PWB via a plated through hole. The pin itself is tapered and has a tapered aperture passing all the way through it terminating in the plated through hole. The pin is also partially bisected at the top to provide relief for the pin to flex inward to provide spring force when the connectors are mated.

16 Claims, 2 Drawing Sheets

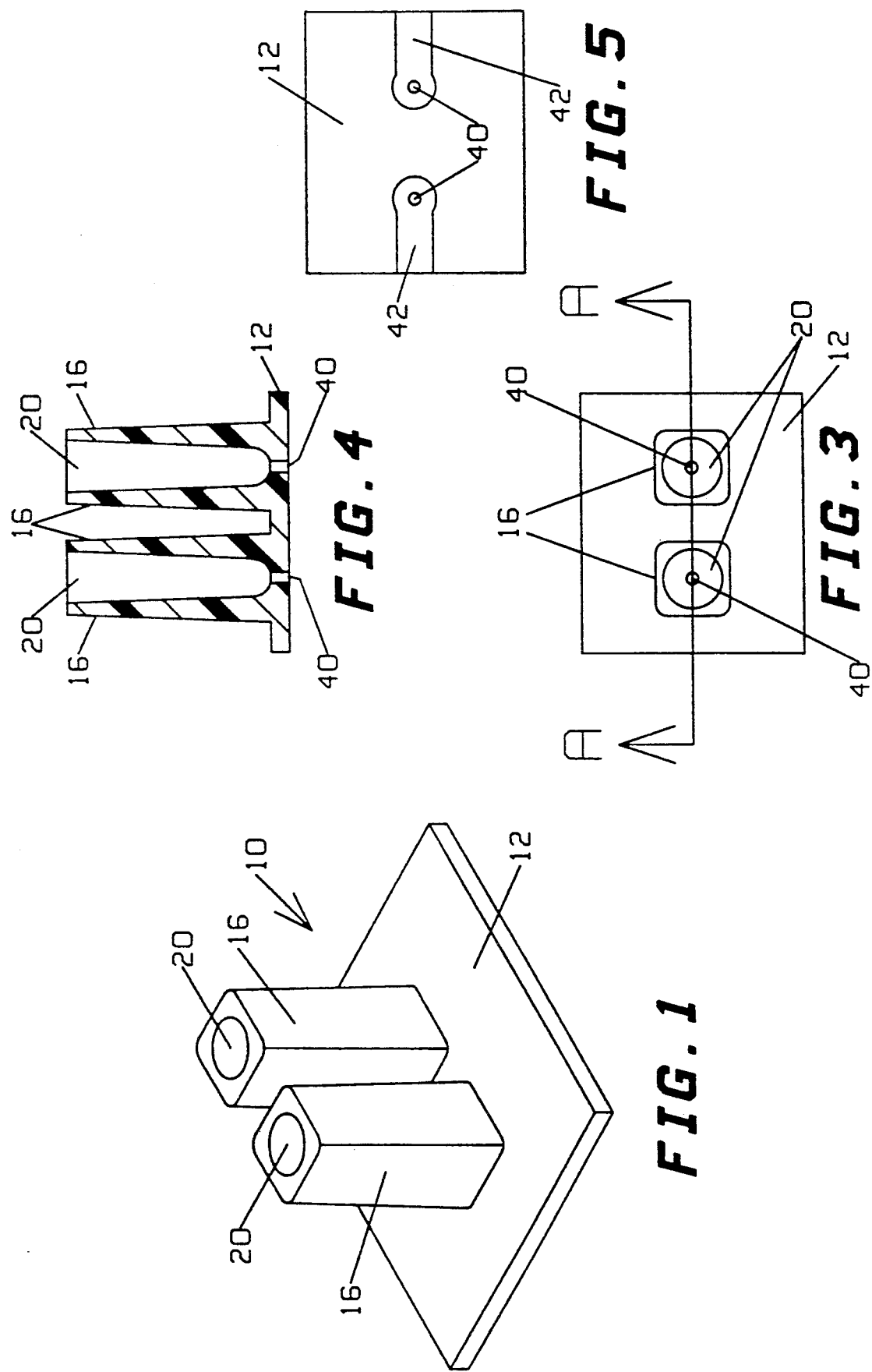

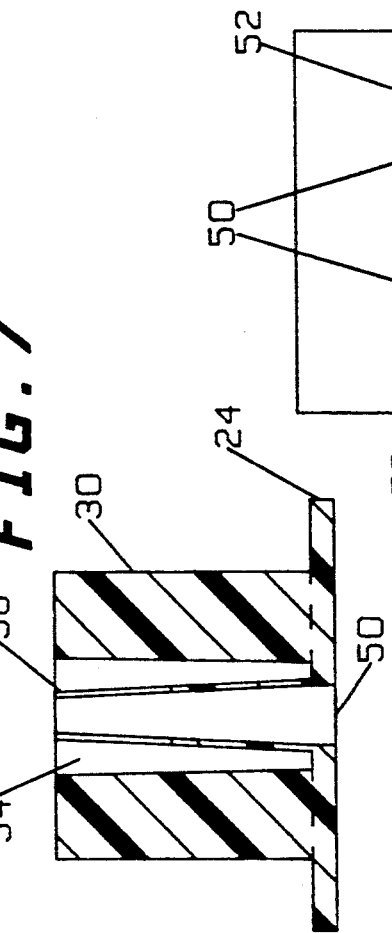
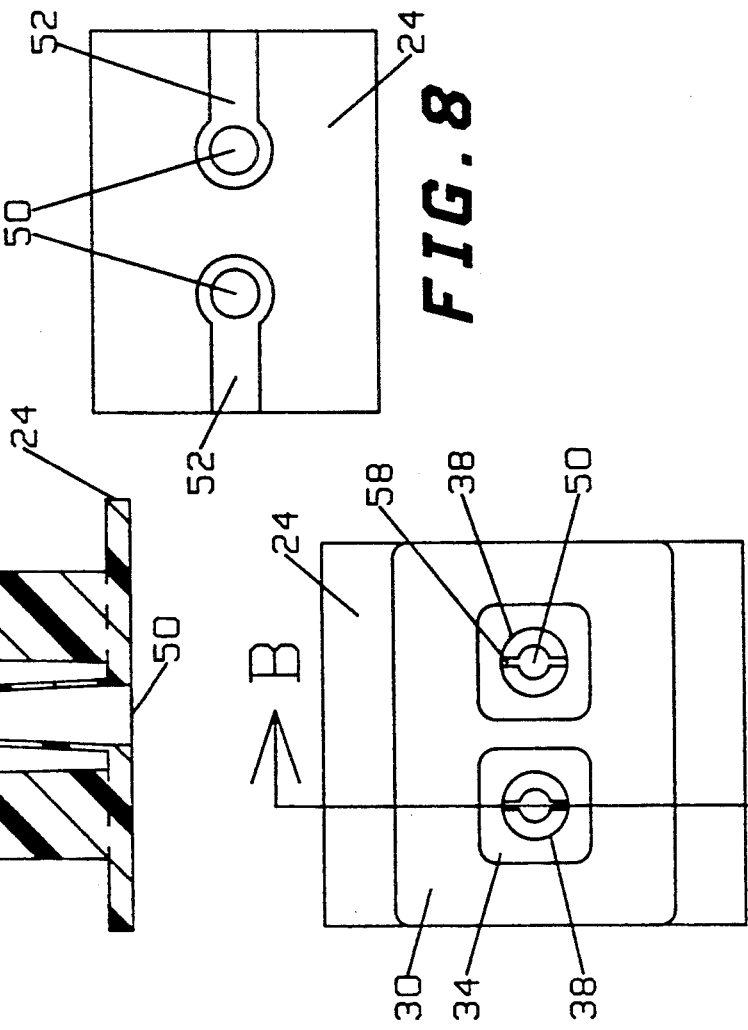
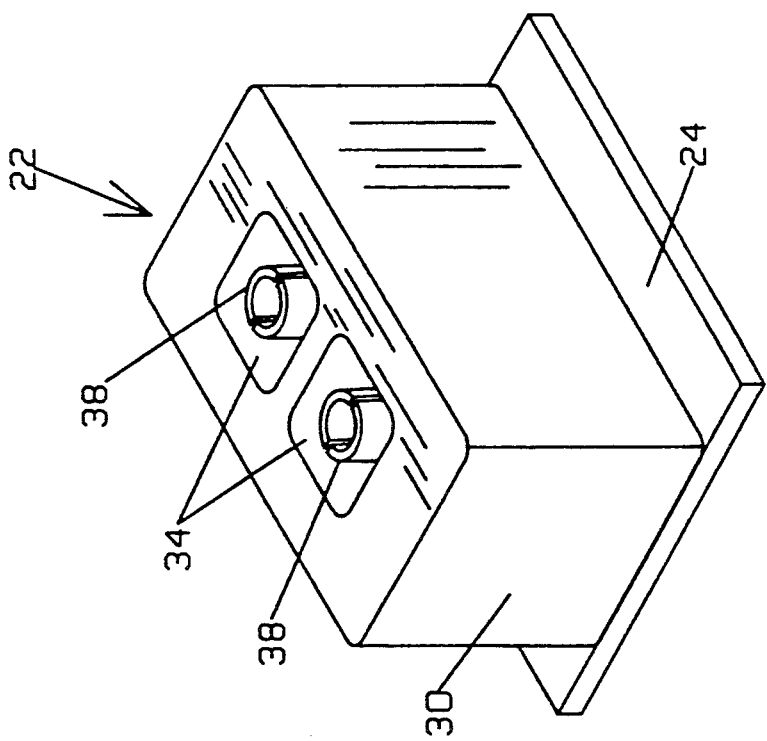
FIG. 8
FIG. 7
FIG. 6
FIG. 2

PLATED ELECTRICAL CONNECTORS

CROSS REFERENCE TO RELATED APPLICATIONS

This application is related to the following patent applications filed simultaneously herewith which are incorporated herein by reference: "Three Dimensional Plating or Etching Process and Masks Therefor", to John Mettler et al., Ser. No. 484,337, filed Feb. 23, 1990; "Plated D-Shell Connector", to Victor Zaderej et al., Ser. No. 484,391, filed Feb. 23, 1990; "Audio Jack Connector", to Victor Zaderej et al., Ser. No. 484,229, filed Feb. 23, 1990; and "Circuit Board Edge Connector", to Victor Zaderej et al., Ser. No. 484,421, filed Feb. 23, 1990.

BACKGROUND

1. Field of the Invention

This invention relates generally to the field of electrical connectors. More particularly, this invention relates to molded electrical connectors with plated or etched electrical contacts.

2. Background of the Invention

There are many applications for low cost connectors for interconnecting two circuit boards Even more desirable is such a connector which can be molded and plated or etched as an integral part of the circuit board itself. This would provide for reduced inventory, parts count and labor as well as material costs.

The present invention provides such a connector which may be used to mate together, for example, various configurations of printed wiring boards (PWB) electrically. In addition, a molded spring is provided which may be used in the present connector as well as other molded connectors to provide a spring forced electrical contact.

SUMMARY OF THE INVENTION

It is an object of the present invention to provide an improved connector for interconnecting circuit boards and similar applications.

It is another object of the present invention to provide such a connector which can be fabricated as an integral part of the circuit boards.

It is a further object of the present invention to provide a molded spring for used in molded connectors.

It is an advantage of the invention that circuit boards can be interconnected without having to install separate connector parts on the boards.

These and other objects and advantages of the invention will become apparent to those skilled in the art upon consideration of the following description of the invention.

A molded and plated or etched connector pair for mating together two printed wiring boards or the like according to the present invention includes a female connector having a column molded as a part of one PWB having a tapered passage therethrough. At least the inside of the tapered passage is plated with a conductive material which is connected to the bottom of the PWB through a plated through hole. The male connector member includes a block molded as a part of its PWB. The block includes a channel which mates with the column of the female connector. A plastic pin is disposed in the middle of the channel and mates with the tapered passage of the female member. The pin is plated with a conductive material and is coupled to the bottom of the male member's PWB via a plated through hole. The pin itself is tapered and has a tapered aperture passing all the way through it terminating in the plated through hole. The pin is also partially bisected at the top to provide relief for the pin to flex inward to provide spring force when the connectors are mated.

A female molded electrical connector according to one embodiment of the present invention includes an electrically insulative substrate. A column extends upward from the substrate. The column has an upper end and also has a lower end adjacent the substrate. A passage, having a wall, is disposed within the column for receiving a male member. The passage extends from the upper end toward the lower end. A conductive plating is disposed on the passage wall for forming an electrical contact for the connector.

A male molded electrical connector according to one embodiment of the present invention includes a molded block, molded from an electrically insulative material. The block has a lower end and an upper end. A channel is formed in the block at the upper end and extends toward the lower end, for receiving a column part of a female connector member. A pin is situated within the channel and has a pin surface. The pin is molded as an integral portion of the block, and mates with a passage within the column part of the female connector. A conductive plating is deposited on the pin surface, for providing an electrical contact for the connector.

A male pin member according to an embodiment of the present invention for a molded plastic connector includes an electrically insulative substrate. A tapered projection, having a surface, a top and a bottom, extends upward from the substrate. A tapered aperture extends through the projection from the top to the bottom. A slit divides the top of the projection into two portions. A plating is disposed on the surface of the projection, for providing an electrical contact surface to the projection.

The features of the invention believed to be novel are set forth with particularity in the appended claims. The invention itself, however, both as to organization and method of operation, together with further objects and advantages thereof, may be best understood by reference to the following description taken in conjunction with the accompanying drawing.

BRIEF DESCRIPTION OF THE DRAWING

FIG. 1 shows a perspective view of a female molded connector according to the present invention.

FIG. 2 shows a perspective view of a male molded connector according to the present invention.

FIG. 3 is a top view of the female molded connector shown in FIG. 1.

FIG. 4 is a sectional view of the molded connector of FIG. 1 taken along line A—A of FIG. 3.

FIG. 5 is a bottom view of the connector of FIG. 1.

FIG. 6 is a top view of the male connector of FIG. 2.

FIG. 7 is a sectional view of the male connector of FIG. 2 taken along line B—B of FIG. 6.

FIG. 8 is a bottom view of the connector of FIG. 8.

DETAILED DESCRIPTION OF THE INVENTION

Turning now to the drawing in which like reference numerals designate corresponding parts throughout the several figures thereof, and in particular to FIG. 1 a female connector according to the present invention is shown generally as connector 10. Connector 10 is preferably molded as an integral part of a substrate 12 which may be a portion of a printed wiring board (PWB). This connector is shown as a two part connector which is defined by a pair of slightly tapered columns 16, but this is not to be limiting. The columns 16 have an approximately square or rectangular cross section with rounded corners in the preferred embodiment. The columns 16 include a passage 20 extending from the top of the column 16 to near the substrate 12 in the preferred embodiment. The passage has a circular cross section in the preferred embodiment. The substrate 12 serves at least to physically hold the columns 16 in an appropriate spaced apart relationship.

The wall of passage 20 is plated with a conductive metal to form an electrical contact surface for the connector. Any of several possible metals may be used for the plating as will be appreciated by those skilled in the art. Although illustrated as a tapered rectangular column 16 with a tapered round passage 20, other shapes such as square, or hexagonal are equally appropriate and within the scope of the present invention.

A mating male connector member 22 is shown in perspective in FIG. 2. The male member 22 is in the form of a rectangular block 30 with a channel 34 fabricated in the top surface thereof and substantially surrounding a male pin member 38. Other shapes may also be used. The channel is appropriately tapered and dimensioned to receive the tapered column 16 of connector member 10 while the pin 38 is appropriately tapered and dimensioned to engage the tapered passage 20. In the preferred embodiment, the channel is approximately square or rectangular in cross section with rounded corners. The outer surface of the block 30 may be plated with a conductive metal to form a shield and the pin is plated with a conductive metal to form a contact which mates with the plating of the wall of the tapered passage 20.

Turning now to FIG. 3 and FIG. 4, the details of the design of the preferred embodiment of the female connector 10 is shown. The passage 20, as shown, is tapered from top to bottom so that the spring of the pin 38 is gradually loaded as the two parts are mated together, as will be discussed more fully later. The wall of the passage 20 is plated with any of a plurality of metals such as gold, copper or nickel to provide a contact surface using the method described in the above incorporated Mettler et al. application or other suitable plating process. As shown in FIG. 5, at the bottom of the passage, a plated through hole 40 is used to interconnect the contact surface of the passage 20 with plated conductive traces 42 on the bottom surface of the circuit board 12.

In the preferred embodiment, the columns 16 are approximately 0.1882 inch square at the top and tapers to approximately 0.200 inch square. The columns are located on 0.300 inch centers in an array which is as large or small as is required to provide an appropriate number of interconnections. For example, sixteen or more such connectors can be laid out in a rectangular array in one embodiment. In other embodiments, individual connector members can be distributed throughout a circuit board as required to make appropriate connections. In other embodiments, distinctive arrangements, such as a T-shape or L-shape can be used to provide a more positive keying of the connection. In addition, unplated or plated structures such as the present connector can be distributed throughout a pair of parallel mated circuit board to serve as stand-offs and to hold the boards together physically.

The PWB substrate 12 may be approximately 0.062 inch in nominal thickness with a total height of the connector 10 and substrate 12 approximately 0.330 inch. The passage 20 is preferably tapered from a diameter of approximately 0.140 inch at the top surface to a diameter of approximately 0.0985 inch at the bottom. The bottom of the passage 20 in this embodiment is at the same level as the top of the substrate 12. Plated through hole 40 may be approximately 0.040 inch in diameter.

While these dimensions, as well as other dimensions disclosed herein, are not intended to be limiting, they provide for a satisfactory mating of the two connector parts. The dimensions disclosed are for the unplated plastic part and assume that a plating thickness of approximately 0.0015 inches will be deposited on the parts in the locations described. The linear tolerance of all dimensions is approximately 0.005 inch unless designated otherwise.

Turning now to FIG. 6 viewed in conjunction with FIG. 7 and FIG. 8, the male connector member 22 of the preferred embodiment is shown in greater detail. In these figures, it can be seen that the male pin member 38 is fabricated as a plastic spring which is tapered from top to bottom. The pin has an approximately circular cross sectional outline with a diameter of approximately 0.1015 inch at the top and approximately 0.150 inch at the bottom. A tapered aperture 50 passes through the pin from top to bottom. The tapered aperture 50 has a diameter of approximately 0.030 at the top tapering out to a diameter of approximately 0.120 at the bottom. When aperture 50 reaches the bottom of the substrate, it connects to plated traces 52 in order to interconnect with electrical components as required.

The male pin also includes a slot 58 which is about 0.030 inch in width and extends down approximately 0.19 inch from the top. The slot 58 and the aperture 50 serve to relieve the plastic pin and provide room for it to compress inward as the male and female connector members 22 and 10 are mated. Otherwise, only if the plastic had a great ability to compress would it be possible to fully mate the two parts. According to this implementation, the bifurcated plastic pin 38 may flex inward to permit full mating of the parts as they are engaged. In other embodiments, the pin may be split into four or six, etc. parts to provide the flexing required for a particular application.

For simplicity in plating, all surfaces within channel 34 may be plated with a suitable metal such as gold, nickel, copper etc. to provide the contact surface required. The outside and top surfaces of the column may also be plated if desired. The contact forces are determined by the tolerances between the mating parts, the dimensions and the characteristics of the material. In the preferred embodiment, General Electric Ultem 2312 brand polyetherimide is used. With this material and the dimensions shown, contact forces vary from approximately 100 to 300 grams of normal force. The design prevents flexing of the material by an excessive amount so that significant stress on the plastic material is avoided.

By using plated through holes on both the male and female parts to couple signals to and from the connector, the need for soldered pins or other parts requiring a secondary operation is eliminated. These plated through holes (40 and 50) can be coupled to circuit traces (42 and 52) in a totally conventional manner to interconnect the contact surfaces of the connector with electrical components (not shown) on the surface of substrates 12 and/or 24.

Many variations of the present invention are contemplated such as the use of different shapes for the column 16 and channel 34, or the pin 38 and passage 20. Such can permit keying of the connectors to assure proper mechanical alignment of the circuit boards. In addition, much larger arrays are specifically contemplated. The coaxial nature of the connector may prove useful for high frequency circuits which can be directly mated to matched striplines connected to the plated through holes on the bottom of the circuit boards. In addition to these variations, by providing more elaborate plating arrangements, it may be possible to provide more than one conductor plus shield in a single connector pair. Also, separate blocks may be provided to facilitate transportation of conductors on the PWB as required. Many other variations and embodiments will occur to those skilled in the art.

Thus it is apparent that in accordance with the present invention, an improved apparatus and method that fully satisfies the objectives, aims and advantages is set forth above. While the invention has been described in conjunction with specific embodiments, it is evident that many alternatives, variations, modifications and permutations will become apparent to those skilled in the art in light of the foregoing description. Accordingly, it is intended that the present invention embrace all such alternatives, variations, modifications and permutations as fall within the spirit and broad scope of the appended claims.

What is claimed as new and desired to be secured by Letters Patent is:

1. A female molded electrical connector, comprising in combination:
   an electrically insulative substrate;
   a column extending upward from said substrate, said column having an upper end and having a lower end adjacent said substrate;
   a passage, having a wall, within said column for receiving a male member, said passage extending from said upper end toward said lower end; and
   plating means, disposed on said passage wall for forming an electrical contact for said connector.

2. The female molded electrical connector of claim 1, wherein said passage comprises a tapered passage having smaller cross sectional area adjacent said upper end than adjacent said lower end.

3. The female molded electrical connector of claim 1, wherein said passage has an approximately circular cross section.

4. The female molded electrical connector of claim 1, wherein said column comprises a tapered column having a larger cross sectional area at said lower end than at said upper end.

5. The female molded electrical connector of claim 1, wherein said column has an approximately square cross section.

6. The female molded electrical connector of claim 1, further comprising a plated through hole in said passage extending from said wall to a lower surface of said substrate.

7. A male molded electrical connector, comprising in combination:
   a molded block, molded from an electrically insulative material, said block having a lower end and an upper end;
   a channel, formed in said block at said upper end extending toward said lower end, for receiving a column part of a female connector member;
   pin means situated within said channel and having a pin surface, said pin means being molded as an integral portion of said block, for mating with a passage within said column part of said female connector; and
   plating means, deposited on said pin surface, for providing an electrical contact for said connector.

8. The male molded electrical connector of claim 7, wherein said channel comprises a tapered channel having a larger cross sectional area adjacent said upper end than adjacent said lower end.

9. The male molded electrical connector of claim 7, wherein said channel has an approximately rectangular cross section.

10. The male molded electrical connector of claim 7, wherein said pin means has an approximately circular cross sectional outline.

11. The male molded electrical connector of claim 7, wherein said pin means is tapered with a smaller area of cross sectional outline adjacent said upper end than adjacent said lower end.

12. The male molded electrical connector of claim 7, wherein said pin means has a length extending from approximately adjacent said upper end to approximately adjacent said lower end, and wherein said pin means includes a split extending along at least a portion of said length adjacent said upper end.

13. The male molded electrical connector of claim 7, further comprising a plated conductor disposed on said lower end of said block, and a through hole electrically coupling said pin means to said plated conductor.

14. The male molded electrical connector of claim 7, further comprising shielding means, plated to an outer surface of said block, for providing electrical shielding to said pin means.

15. The male molded electrical connector of claim 8, wherein said pin means further comprises:
   a tapered projection, having a surface, a top and a bottom, extending through said channel;
   a tapered aperture extending through said projection from said top to said bottom; and
   a slit dividing the top of said projection into two portions.

16. A male pin member for a molded plastic connector, comprising in combination:
   an electrically insulative substrate;
   a tapered projection, having a surface, a top and a bottom, extending upward from said substrate;
   a tapered aperture extending through said projection from said top to said bottom;
   a slit dividing the top of said projection into two portions; and
   plating means, disposed on the surface of said projection, for providing an electrical contact surface to said projection.

* * * * *